United States Patent
Sasaya et al.

(10) Patent No.: US 11,921,137 B2
(45) Date of Patent: Mar. 5, 2024

(54) ANOMALY DETECTION APPARATUS, METHOD, AND PROGRAM

(71) Applicants: KABUSHIKI KAISHA TOSHIBA, Tokyo (JP); Toshiba Infrastructure Systems & Solutions Corporation, Kawasaki (JP)

(72) Inventors: Tenta Sasaya, Tokyo (JP); Takashi Watanabe, Yokohama (JP); Toshiyuki Ono, Kawasaki (JP)

(73) Assignees: KABUSHIKI KAISHA TOSHIBA, Tokyo (JP); Toshiba Infrastructure Systems & Solutions Corporation, Kawasaki (JP)

(\*) Notice: Subject to any disclaimer, the term of this patent is extended or adjusted under 35 U.S.C. 154(b) by 0 days.

(21) Appl. No.: 17/651,306

(22) Filed: Feb. 16, 2022

(65) Prior Publication Data

US 2023/0079397 A1 Mar. 16, 2023

(30) Foreign Application Priority Data

Sep. 15, 2021 (JP) .................................. 2021-150373

(51) Int. Cl.
*G01R 23/16* (2006.01)
(52) U.S. Cl.
CPC .................................. *G01R 23/16* (2013.01)
(58) Field of Classification Search
CPC .............................. G01R 23/16; G01R 31/2829

USPC ................................... 324/76.77, 76.11, 500
See application file for complete search history.

(56) References Cited

U.S. PATENT DOCUMENTS

| | | | |
|---|---|---|---|
| 8,797,047 B2 * | 8/2014 | Jiang | G01D 18/00 324/613 |
| 10,317,441 B2 * | 6/2019 | Chen | G01R 23/16 |
| 2022/0221493 A1 * | 7/2022 | Klammler | G01R 23/16 |
| 2022/0261600 A1 * | 8/2022 | Liao | G06F 18/2415 |
| 2022/0383187 A1 * | 12/2022 | Rama | G06F 18/214 |
| 2023/0251292 A1 * | 8/2023 | Ritter | G06F 3/14 702/67 |

OTHER PUBLICATIONS

Jolliffe, I.T. "Principal Component Analysis", Second Edition, Springer, p. 37, 232-268, (2002) 518 pages.

\* cited by examiner

*Primary Examiner* — Giovanni Astacio-Oquendo
(74) *Attorney, Agent, or Firm* — Oblon, McClelland, Maier & Neustadt, L.L.P.

(57) ABSTRACT

According to one embodiment, an anomaly detection apparatus includes a processing circuit configured to calculate a reconstruction error of an input signal being a time-series signal, calculate cycle information indicating cyclic property of the reconstruction error, and determine presence/absence of an anomaly signal in the input signal on the basis of the cycle information or the cycle information and the reconstruction error.

10 Claims, 11 Drawing Sheets

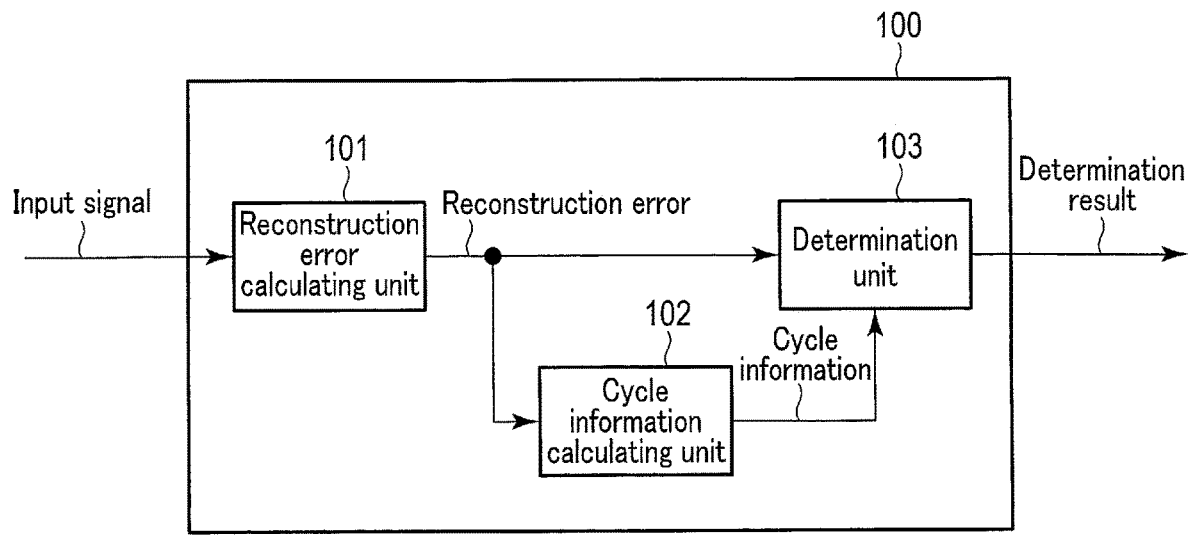
F I G. 1
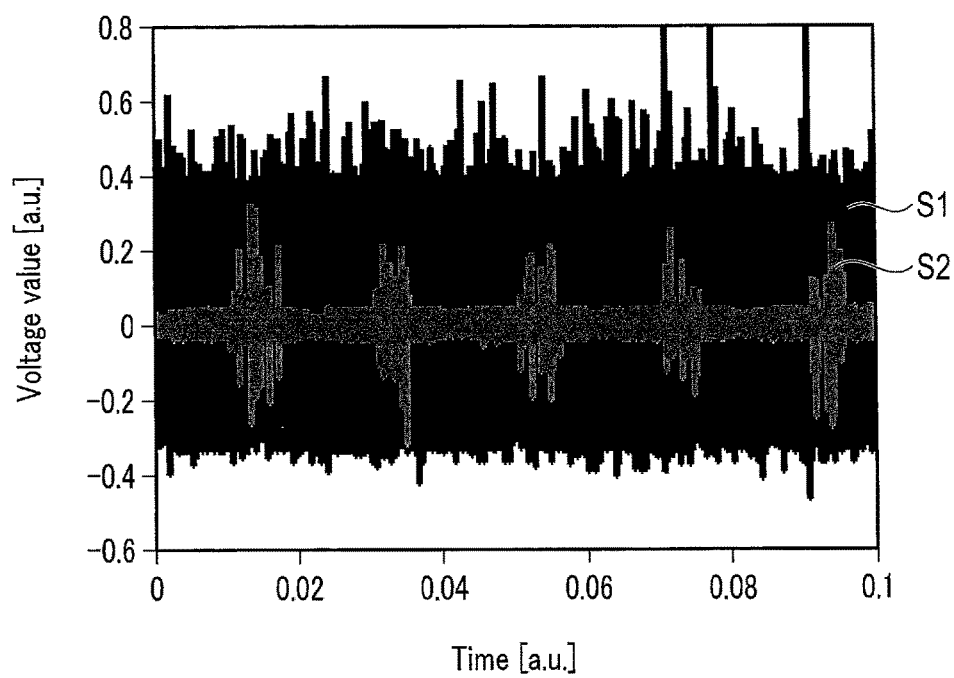
F I G. 2

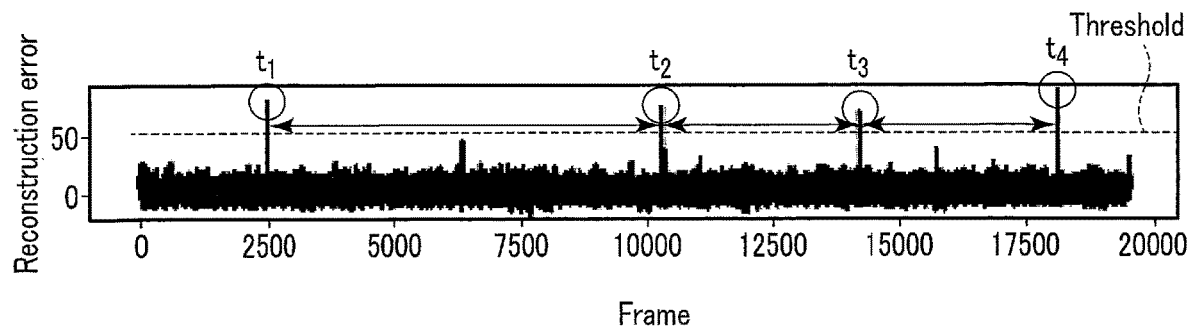
F I G. 7
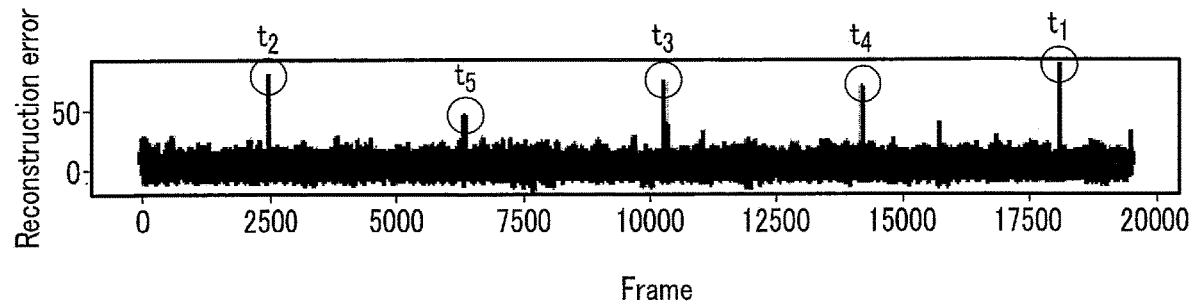
F I G. 8
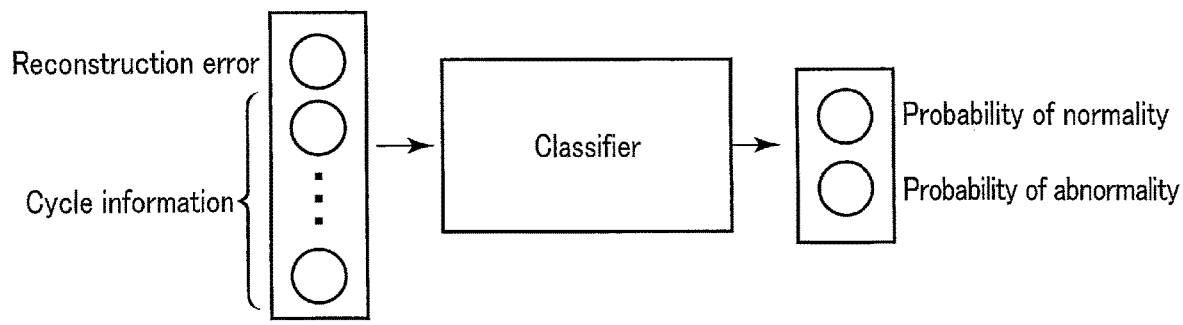
F I G. 9

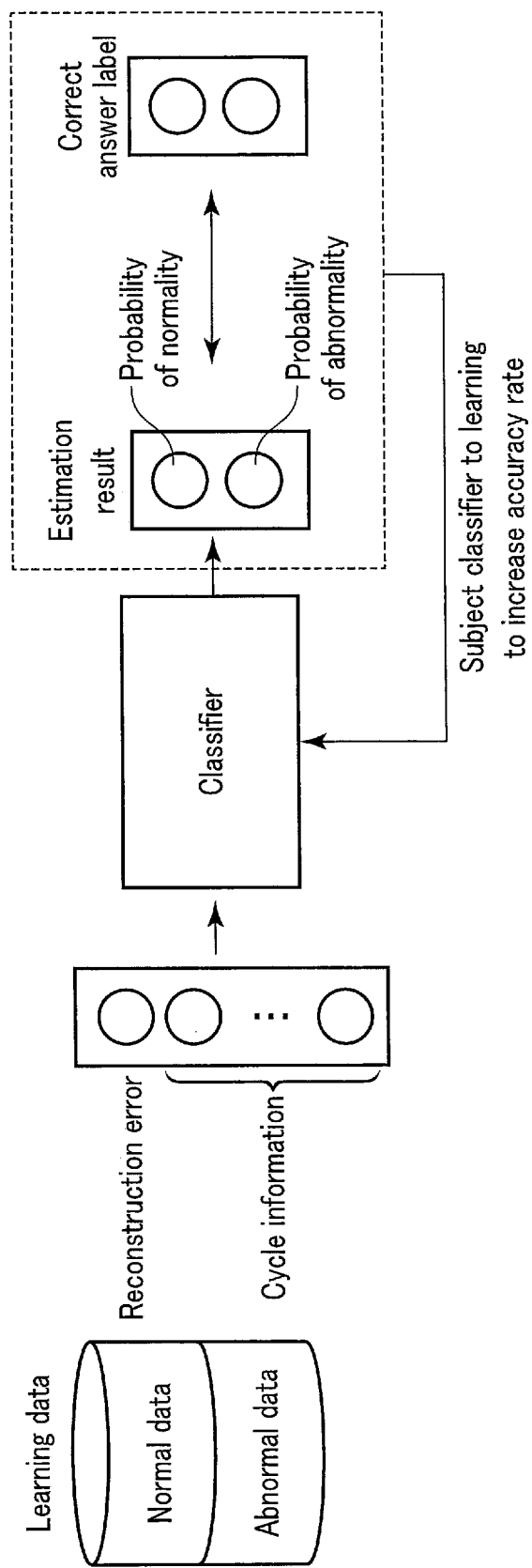
F I G. 10

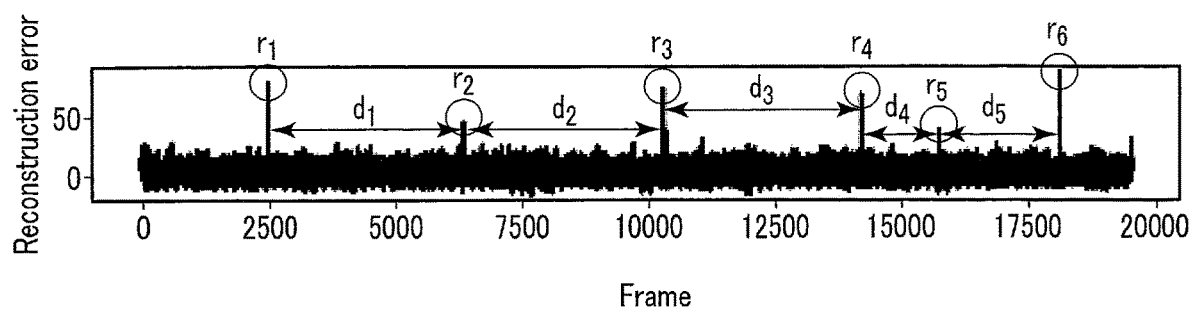
F I G. 11

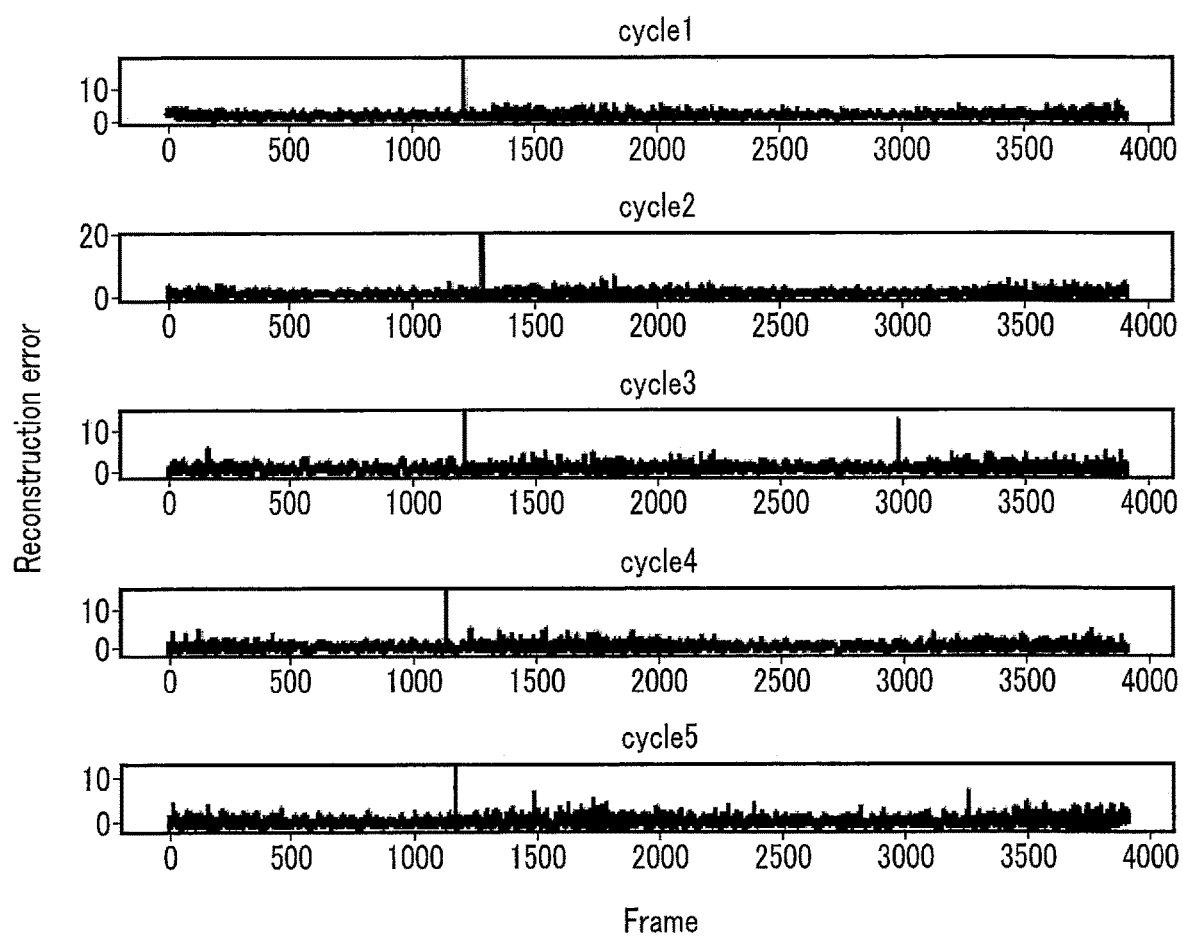
F I G. 16

ANOMALY DETECTION APPARATUS, METHOD, AND PROGRAM

CROSS-REFERENCE TO RELATED APPLICATION

This application is based upon and claims the benefit of priority from Japanese Patent Application No. 2021-150373, filed Sep. 15, 2021, the entire contents of which are incorporated herein by reference.

FIELD

Embodiments described herein relate generally to an anomaly detection apparatus, a method, and a program.

BACKGROUND

In recent years, with spread of IoT (Internet of Things), it has become easy to monitor states of apparatuses of social infrastructure and manufacturing lines, and the like, using sensors. For this reason, much attention is paid to techniques of anomaly detection and/or malfunction of apparatuses using sensor signals acquired from sensors.

One of anomaly detection techniques using one-dimensional signals, such as sensor signals, is a method using principal component analysis. In a method using principal component analysis, dimension reduction is executed for an input signal, and thereafter reconstruction is executed. In this operation, when most of the input signal is a normal signal or noise, only a noise component is reconstructed, and an anomaly signal component is hard to be reconstructed. For this reason, an anomaly signal can be detected using the magnitude of a reconstruction error serving as an error between the reconstructed signal and the input signal.

When the input signal includes an accidental noise component, the reconstruction error may locally increase. In the method using principal component analysis, because anomaly detection is executed with attention paid only to the magnitude of the reconstruction error, an accidental noise component may be erroneously detected as an anomaly signal. In addition, when the reconstruction error locally increases due to accidental noise, there are cases where the reconstruction error at the time when an anomaly signal occurs becomes smaller than the reconstruction error at the time when a normal signal occurs and the anomaly signal is not normally detected.

BRIEF DESCRIPTION OF THE DRAWINGS

FIG. 1 is a diagram illustrating an example of configuration of an anomaly detection apparatus according to a first embodiment;

FIG. 2 is a diagram illustrating an example of an input signal acquired with the anomaly detection apparatus according to a first embodiment;

FIG. 7 is a diagram illustrating a state of selection of values of the reconstruction error each being equal to or larger than a predetermined threshold from the reconstruction error illustrated in FIG. 3;

FIG. 8 is a diagram illustrating a state of selection of values of the reconstruction error in descending order from the reconstruction error illustrated in FIG. 3;

FIG. 9 is a diagram illustrating an example of a classifier used as a machine learning model in the anomaly detection apparatus according to the first embodiment;

FIG. 10 is a diagram illustrating an example of a learning method for the classifier illustrated in FIG. 9;

FIG. 11 is a diagram illustrating an example of a method for calculating a weighted reconstruction error using the reconstruction error illustrated in FIG. 3;

FIG. 16 is a diagram illustrating reconstruction errors calculated for the respective short-time signals with the anomaly detection apparatus according to the second embodiment;

DETAILED DESCRIPTION

Figure 3:
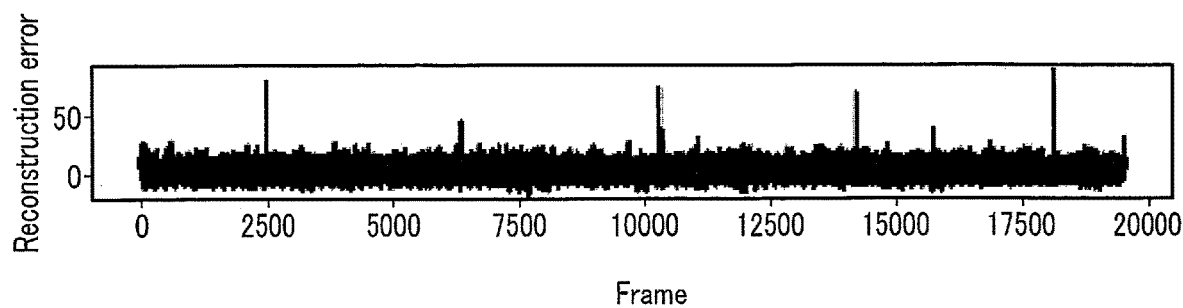
FIG. 3 is a diagram illustrating an example of a reconstruction error calculated with the anomaly detection apparatus according to the first embodiment.

According to one embodiment, an anomaly detection apparatus includes a processing circuit configured to calculate a reconstruction error of an input signal being a time-series signal, calculate cycle information indicating cyclic property of the reconstruction error, and determine presence/absence of an anomaly signal in the input signal on the basis of the cycle information or the cycle information and the reconstruction error.

The following is an explanation of embodiments of an anomaly detection apparatus, a method, and a program with reference to drawings. In the following explanation, constituent elements having substantially the same functions and structures will be denoted by the same reference numerals, and overlapping explanations thereof will be made only when necessary.

The anomaly detection apparatus according to each of the following embodiments is a diagnostic apparatus acquiring a sensor signal acquired from a device, determining presence/absence of an anomaly signal in the acquired sensor signal, and diagnosing anomaly, malfunction, and/or state of the device on the basis of a determination result. Examples of such a diagnostic apparatus include a device analyzing a sensor signal and diagnosing malfunction of a high-voltage power plant, and a device analyzing rotation sound of rotary member or the like used for a coil and the like and anomaly detection. The anomaly detection apparatus may also be referred to as "signal processing apparatus".

First Embodiment

FIG. 1 is a diagram illustrating configuration of an anomaly detection apparatus 100 according to a first embodiment. The anomaly detection apparatus 100 is connected to a high-voltage power plant via a network or the like.

The anomaly detection apparatus 100 detects a sensor signal to detect anomaly of the high-voltage power plant and/or a coil. For example, an ordinary AE sensor attached to a high-voltage power plant is used as the sensor. The anomaly detection apparatus 100 determines presence/absence of a signal (hereinafter referred to as "anomaly signal") indicating anomaly in a sensor signal, and detects anomaly on the basis of a result of the determination. When the size of the sensor signal is large, the anomaly detection apparatus 100 may perform continuous monitoring and analyze only data determined as anomaly data.

The network is, for example, a LAN (local area network). Connection to the network may be wired connection or wireless connection. The network is not limited to a LAN, but may be the Internet or a public communication line.

The anomaly detection apparatus 100 includes a processing circuit controlling the whole anomaly detection apparatus 100 and a storage medium (memory). The processing circuit is a processor executing functions of a reconstruction error calculating unit 101, a cycle information calculating unit 102, and a determination unit 103 by calling and executing a program in the storage medium. The processing circuit is formed of an integrated circuit including a CPU (Central Processing Unit), an ASIC (Application Specific Integrated Circuit), or a FPGA (Field Programmable Gate Array) or the like. The processor may be formed of an integrated circuit or a plurality of integrated circuits.

The storage medium stores therein processing programs used with the processor and parameters and tables and the like used for arithmetic operations with the processor. The storage medium is a storage device, such as a HDD (Hard Disk Device), a SSD (Solid State Drive), and an integrated circuit and the like, storing various types of information therein. The storage device may be a portable storage medium, such as a CD (Compact Disc), a DVD (Digital Versatile Disc), and a flash memory, as well as a HDD and a SSD, or a drive device reading and writing various types of information from and to a semiconductor memory, such as a RAM (Random Access Memory).

The functions of the reconstruction error calculating unit 101, the cycle information calculating unit 102, and the determination unit 103 may be achieved with a single processing circuit, a plurality of independent processors may be combined to form the processing circuit, and the functions may be achieved by execution of the programs with the respective processors. The functions of the reconstruction error calculating unit 101, the cycle information calculating unit 102, and the determination unit 103 may be implemented as individual hardware circuits.

The reconstruction error calculating unit 101 acquires an input signal from a sensor attached to the high-voltage power plant and/or the coil. The input signal is a voltage value acquired from the sensor. FIG. 2 is a diagram illustrating an example of the input signal. The horizontal axis of FIG. 2 indicates the time. The vertical axis of FIG. 2 indicates the voltage value.

The input signal is a time-series signal including noise generated from a peripheral device or the like. The noise includes stationary noise and nonstationary noise. In the input signal, a signal generated stationarily due to stationary noise is referred to as "normal signal", and a signal generated nonstationarily due to nonstationary noise is referred to as "noise". When any anomaly occurs in the high-voltage power plant and/or the coil, the input signal becomes a signal in which an anomaly signal is mixed with the normal signal and the noise, as illustrated in FIG. 2. The generation timing of an anomaly signal is periodic. A region S1 in FIG. 2 indicates the total value of the normal signal and the anomaly signal, and a region S2 in FIG. 2 indicates the value of the anomaly signal.

The reconstruction error calculating unit 101 calculates a reconstruction error by a predetermined calculation method on the basis of the acquired input signal. Examples of the calculation method for a reconstruction error include principal component analysis, kernel principal component analysis, Auto Encoder, Variational AutoEncoder (VAE), Generative Adversarial Network (GAN).

The present embodiment illustrates the case of using principal component analysis as the method for calculating a reconstruction error. In principal component analysis, the input signal is divided into a plurality of short-time frames. Thereafter, the divided frames are subjected to dimension reduction and thereafter reconstruction is executed. In reconstruction, an anomaly signal component is hard to reconstruct. For this reason, the reconstructed signal is a signal normally reflecting only components of the normal signal and noise in the input signal. Thereafter, a difference between the reconstructed signal and the input signal is calculated for each of the divided frames. In this manner, a reconstruction error reflecting the magnitude of the anomaly signal is calculated. FIG. 3 is a diagram illustrating an example of the reconstruction error. The horizontal axis of FIG. 3 indicates the frame. The vertical axis of FIG. 3 indicates the value of the reconstruction error.

Figure 4:
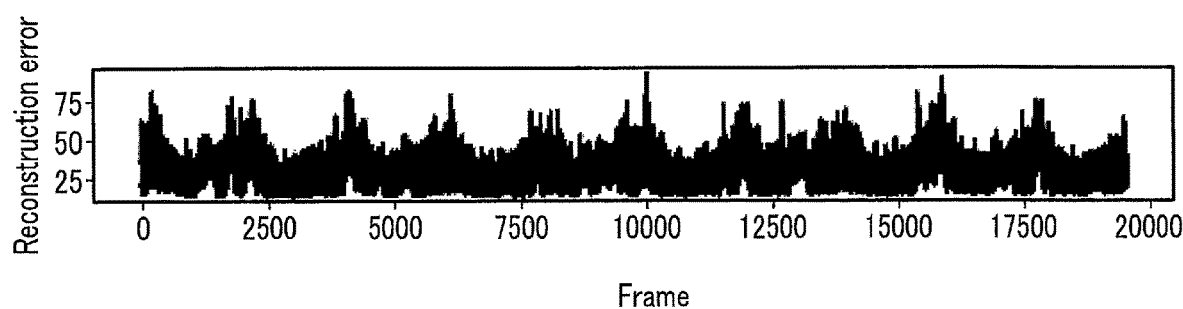
FIG. 4 is a diagram illustrating an example of a reconstruction error calculated with the anomaly detection apparatus according to the first embodiment before smoothing.
Figure 5:
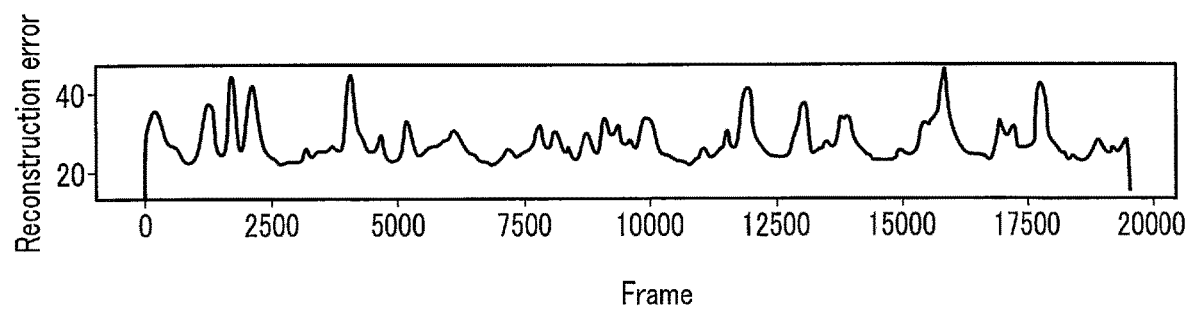
FIG. 5 is a diagram illustrating an example of a reconstruction error acquired by smoothing the reconstruction error illustrated in FIG. 4.
Figure 6:
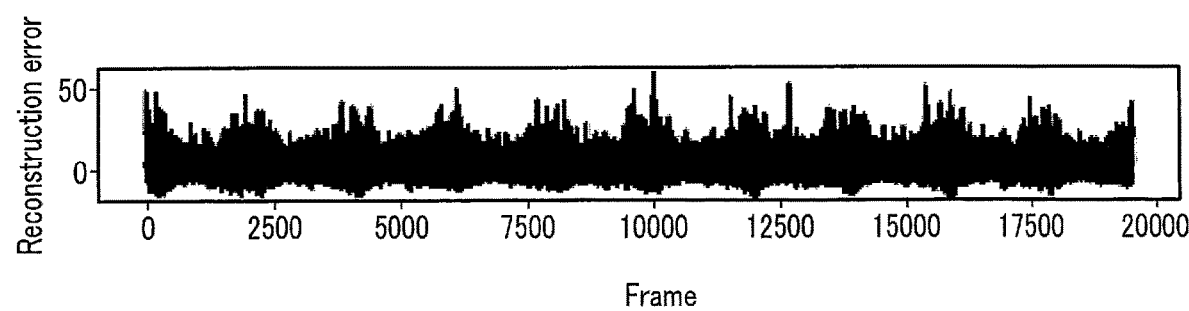
FIG. 6 is a diagram illustrating an example of reconstruction error acquired by subtracting the smoothed reconstruction error illustrated in FIG. 5 from the nonsmoothed reconstruction error illustrated in FIG. 4.

The reconstruction error calculating unit 101 corrects bias (swell) of the reconstruction error after the reconstruction error is calculated. In this operation, the reconstruction error calculating unit 101 executes, for example, smoothing for the calculated reconstruction error and subtracts the smoothed reconstruction error from the nonsmoothed reconstruction error to correct fluctuations of the reconstruction error. FIG. 4 is a diagram illustrating an example of the reconstruction error before smoothing. FIG. 5 is a diagram illustrating a reconstruction error acquired by smoothing the reconstruction error illustrated in FIG. 4. FIG. 6 is a diagram illustrating an example of a reconstruction error acquired by subtracting the smoothed reconstruction error illustrated in FIG. 5 from the nonsmoothed reconstruction error illustrated in FIG. 4. In FIG. 4 to FIG. 6, the horizontal axis indicates the frame, and the vertical axis indicates the value of the reconstruction error. Examples of the smoothing include convolution using a moving average filter and approximation to any function.

The cycle information calculating unit 102 calculates cycle information indicating the cycle of the reconstruction error. The cycle information is a feature quantity indicating the cycle of the reconstruction error. The cycle information is, for example, a coefficient acquired by executing Fourier transform for the reconstruction error, spectrum, or a spectrogram.

The cycle information may be an index indicating the degree of dispersion of times of two or more values of the reconstruction error selected on the basis of the magnitude of the value. For example, a parameter used as the cycle information is a parameter relating to a distance between times at which the reconstruction error has a value equal to or larger than a predetermined threshold. In this case, the cycle information calculating unit 102 selects the times at which the reconstruction error has a value equal to or larger than the predetermined threshold as t=(t1, t2, . . . , tN), and calculates a difference $d_i$ (=$|t_i-t_j|$, i≠j, 1≤I, j≤N) between the selected times as cycle information. As the threshold, for example, the mean value or the standard deviation of values of the reconstruction error is used. FIG. 7 is a diagram illustrating a state of selection of values of the reconstruction error each being equal to or larger than the predetermined threshold from the reconstruction error illustrated in FIG. 3.

The parameter used as the cycle information may be a parameter relating to a distance between times of two or more values of the reconstruction error selected in descending order. In this case, the cycle information calculation unit 102 selects, for example, a plurality of times as t=(t1, t2, . . . tN) in descending order of values of the reconstruction error, and calculates the difference $d_i$ (=$|t_i-t_j|$, i≠j, I≤I, j≤N) between the selected times as the cycle information. FIG. 8 is a diagram illustrating a state of selection of values of the reconstruction error in descending order from the reconstruction error illustrated in FIG. 3.

Instead of the difference $d_i$, a statistic of the differences $d_i$ may be used as the cycle information. Examples of the statistic include an average, a standard deviation, a maximum value, and a minimum value. In addition to the difference $d_i$, a statistic of the difference $d_i$ may be used as the cycle information.

As another example, the cycle information may be similarity between a reference signal synchronized with the cycle of the input signal and the reconstruction error. In this case, the cycle information calculating unit 102 acquires, for example, an AC voltage signal and/or a trigger signal applied when the input signal is acquired as the reference signal, and calculates a distance between vectors of the reconstruction error and the reference signal as the cycle information.

The determination unit 103 determines presence/absence of an anomaly signal in the input signal on the basis of the cycle information or the cycle information and the reconstruction error. The determination unit 103 outputs a result of determination of presence/absence of an anomaly signal to an external device, such as a display device.

An example of determining presence/absence of an anomaly signal in the input signal is a method of calculating a weighted sum of the cycle information and the reconstruction error as anomaly degree, and determining whether the anomaly degree is larger than a preset threshold. In this method, the determination unit 103 determines that an anomaly signal exists in the input signal for the time at which the anomaly degree is larger than the threshold. The determination unit 103 determines that no anomaly signal exists in the input signal for the time at which the anomaly degree is equal to or smaller than the threshold.

Another example of the method for determining presence/absence of an anomaly signal in the input signal is a method of acquiring a vector generated from the cycle information and the reconstruction error as a feature vector, and applying an identification method using a machine learning model for the acquired feature vector. In this case, the determination unit 103 determines presence/absence of an anomaly signal in the input signal by determining whether the probability that the reconstruction error belongs to an anomaly class is larger than a preset threshold. Examples of the identification method using a machine learning model include identification methods, such as a neural network, Light GBM (Light Gradient Boosting Machine), SVM (Support Vector Machine), linear regression, and random forest, and outlier detection methods, such as OCSVM (One Class SVM), MT (Maharanobis-Taguchi) method, and LOF (Local Outlier Factor).

FIG. 9 is a diagram illustrating an example of a classifier used as a machine learning model in the identification method using a machine learning model. The classifier is trained to receive the reconstruction error and the cycle information as inputs, and output the probability of normality and the probability of anomaly of the input reconstruction error. Specifically, the probability of normality is the probability that no anomaly signal is included in the input signal. The probability of anomaly is the probability that an anomaly signal is included in the input signal.

FIG. 10 is a diagram illustrating an example of a learning method for the classifier illustrated in FIG. 9. As illustrated in FIG. 10, when learning of the classifier is executed, learning data and correct answer labels associated with the learning data. The learning data includes normal data including no anomaly signal in the input signal, and anomaly data including an anomaly signal in the input signal. These learning data are successively input to the classifier to cause the classifier to output the probability of normality and the probability of anomaly as an estimation result. Thereafter, the estimation result is compared with the correct answer labels to determine whether the estimation result is correct. The classifier is further subjected to learning to increase the accuracy rate of the estimation results.

Another example of the method for determining presence/absence of an anomaly signal in the input signal is a method of weighting the reconstruction error on the basis of the cycle information and determining presence/absence of an anomaly signal on the basis of the weighted reconstruction error. The following is an explanation of an example of a method for calculating a weighted reconstruction error. FIG. 11 is a diagram illustrating an example of the method for calculating a weighted reconstruction error using the reconstruction error illustrated in FIG. 3. The following is an explanation of an example of the method for calculating a weighted reconstruction error in the case of using a difference $d_i$ between times as the cycle information. In this method, the following expression (1) is used to calculate a weighted reconstruction error $r_{iw}$ by weighting the reconstruction error $r_i$ using the absolute value of the difference between the difference $d_i$ and the average value $d_{ave}$ of the differences $d_i$ in the vicinity of the reconstruction error $r_i$ serving as the weighting target.

$$r_{iw} = \frac{r_i}{\min(|d_{i-1} - d_{ave}|, |d_i - d_{ave}|)} \quad (1)$$

In the method described above, the cycle of the input signal is considered as well as the magnitude of the reconstruction error to enhance the detection accuracy of an anomaly signal having cyclic property. By contrast, when the signal value of noise is large, difficulty exists in seizing the characteristics of the signal from the reconstruction error. For this reason, when the signal value of noise is large, it is also preferable to determine presence/absence of an anomaly signal only with reference to the cycle information. In this case, for example, presence/absence of an anomaly signal in the input signal is determined by executing threshold processing for the acquired value of the cycle information. As another example, presence/absence of an anomaly signal in the input signal may be determined using a machine learning model outputting the probability of anomaly of the input signal on the basis of input of the cycle information of the input signal.

Figure 12:
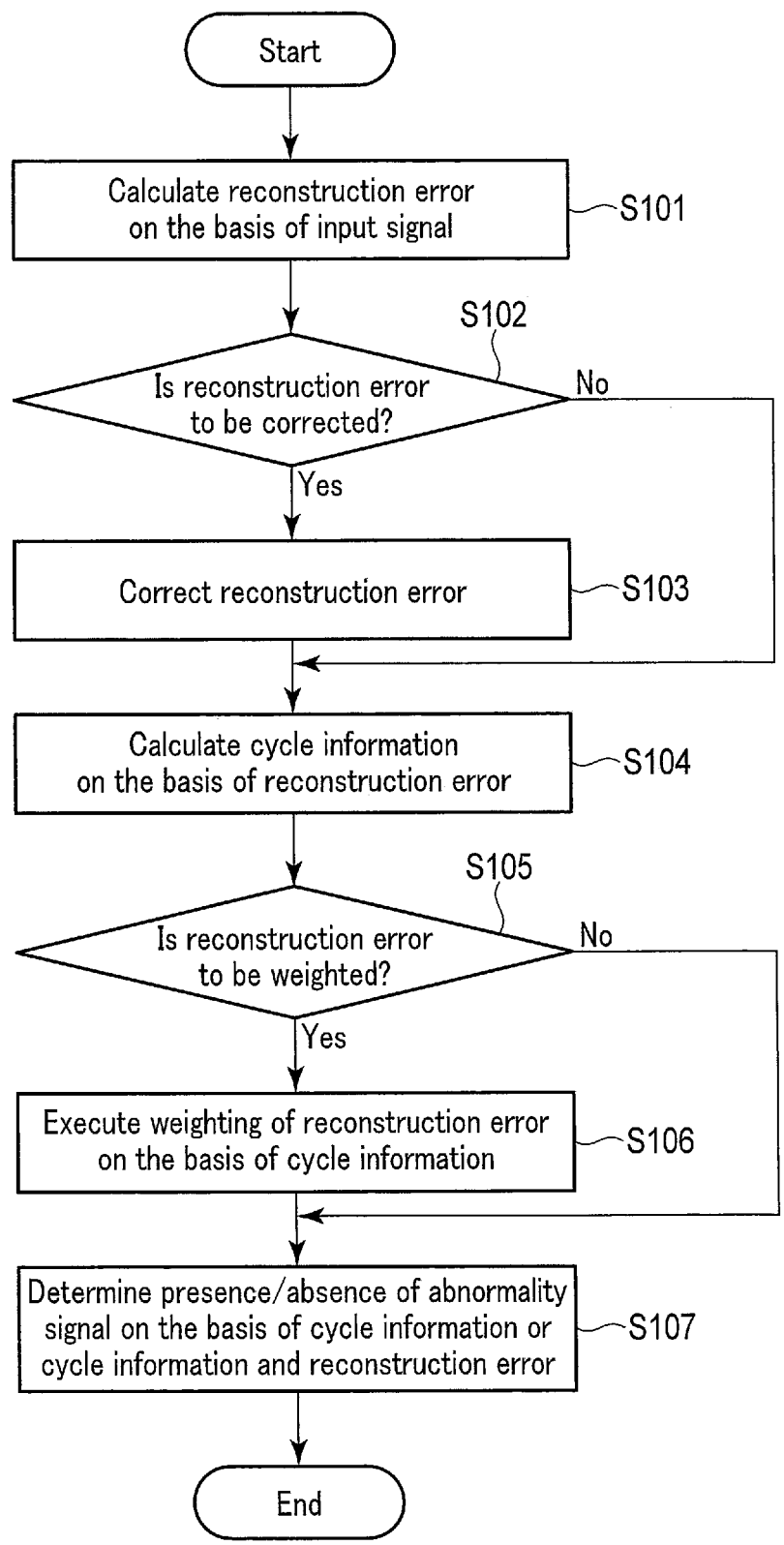
FIG. 12 is a flowchart illustrating processing procedure of anomaly detection processing with the anomaly detection apparatus according to the first embodiment.

The following is an explanation of operations of a process executed with the anomaly detection apparatus 100. FIG. 12 is a flowchart illustrating an example of a process of anomaly detection processing. The anomaly detection processing is processing of anomaly detection of a device on the basis of signals acquired from the device, such as a high-voltage power plant and a coil. The processing procedure in each processing explained hereinafter is a mere example, and each processing can be properly modified as long as modification is possible. In the processing procedure explained hereinafter, proper omission, replacement, and addition of steps are possible according to the embodiment.

(Anomaly Detection Processing)

(Step S101)

First, the reconstruction error calculating unit 101 acquires an input signal, and calculates a reconstruction error on the basis of the acquired input signal. Thereafter, the reconstruction error calculating unit 101 outputs the calculated reconstruction error to the cycle information calculating unit 102 and the determination unit 103.

(Step S102)

Thereafter, the reconstruction error calculating unit 101 determines whether to execute correction of the reconstruction error calculated at Step S101. In this operation, the reconstruction error calculating unit 101 determines whether to execute correction of the reconstruction error in accordance with, for example, setting stored in advance or a user's input. When correction of the reconstruction error is executed (Yes at Step 8102), the process proceeds to Step S103. When no correction of the reconstruction error is executed (No at Step S102), the process proceeds to Step S104.

(Step S103)

The reconstruction error calculating unit 101 smooths the reconstruction error by executing predetermined smoothing. Thereafter, the reconstruction error calculating unit 101 corrects the reconstruction error by subtracting the smoothed reconstruction error from the nonsmoothed reconstruction error. Thereafter, the process proceeds to Step S104.

(Step S104)

The cycle information calculating unit 102 calculates cycle information on the basis of the reconstruction error, and outputs the calculated cycle information to the determination unit 103.

(Step S105)

The determination unit 103 determines whether to weight the reconstruction error. In this operation, the determination unit 103 determines whether to execute weighting of the reconstruction error in accordance with, for example, setting stored in advance and/or a user's input. When weighting of the reconstruction error is executed (Yes at Step S105), the process proceeds to Step S106. When no weighting of the reconstruction error is executed (No at Step S105), the process proceeds to Step S107.

(Step S106)

The determination unit 103 executes weighting of the reconstruction error on the basis of the cycle information. In this operation, the determination unit 103 calculates a weighted reconstruction error using, for example, the expression (1) described above. After the reconstruction error is weighted, the process proceeds to Step S107.

(Step S107)

The determination unit 103 determines presence/absence of an anomaly signal in the input signal, and outputs a determination result. For example, the determination unit 103 calculates a weighted sum of the cycle information and the reconstruction error as the anomaly degree, and determines presence/absence of an anomaly signal in the input signal by determining whether the anomaly degree is larger than a preset threshold.

The following is an explanation of effects of the anomaly detection apparatus 100 according to the present embodiment.

When a reconstruction error is calculated from the input signal using principal component analysis, the reconstruction error may locally increase when the input signal includes an accidental noise component. Because anomaly detection is executed with attention only to the magnitude of the reconstruction error in the method using principal component analysis, an accidental noise component may be erroneously detected as an anomaly signal. In addition, when a reconstruction error locally increases due to accidental noise, there are cases wherein the value of the reconstruction error at the time when an anomaly signal occurs is smaller than the value of the reconstruction error at the time when a normal signal occurs and an anomaly signal is not normally detected.

The anomaly detection apparatus 100 according to the present embodiment is capable of calculating a reconstruction error of the input signal being a time-series signal, calculating cycle information indicating cyclic property of the reconstruction error, and determining presence/absence of an anomaly signal in the input signal on the basis of the cycle information or the cycle information and the reconstruction error.

The cycle information is a feature quantity indicating the cyclic property of the reconstruction error, and is, for example, a coefficient executing Fourier transform for the reconstruction error, spectrum, a spectrogram, or the degree of dispersion of times of a plurality of values of the reconstruction error selected on the basis of the magnitude of the value. As another example, the cycle information is the degree of dispersion of two or more times selected on the basis of the magnitude of the values of the reconstruction error.

When presence/absence of an anomaly signal is determined, for example, a weighted sum of the cycle information and the reconstruction error as the anomaly degree to determine whether the anomaly degree is larger than a preset threshold. As another example, presence/absence of an anomaly signal is determined by acquiring a vector generated from the cycle information and the reconstruction error as a feature vector and applying a predetermined identification method using machine learning to the acquired feature vector.

When an anomaly signal having cyclic property is included in the input signal, the anomaly signal has an influence on the cyclic property of the input signal and the reconstruction error. For this reason, the anomaly detection apparatus 100 according to the present embodiment enables determination as to whether the reconstruction error is caused by an anomaly signal having cyclic property or the selected value of the reconstruction error is caused by noise having no cyclic property, by generating cycle information indicating cyclic property of the reconstruction error and determining presence/absence of an anomaly signal in the input signal using the generated cycle information. This structure improves anomaly detection performance for an anomaly signal having cyclic property.

The cycle information may be a reference signal synchronized with the cycle of the input signal. In this case, the anomaly detection apparatus 100 is capable of acquiring a reference signal synchronized with the cycle of the input signal, and calculating similarity between the reconstruction error and the reference signal as the cycle information. This structure further improves anomaly detection performance for an anomaly signal having cyclic property.

The anomaly detection apparatus 100 according to the present embodiment is also capable of correcting the reconstruction error by calculating a smoothed signal on the basis of the reconstruction error and subtracting the smoothed signal from the reconstruction error. With this structure, the anomaly detection apparatus 100 according to the present embodiment enables further improvement of anomaly detection performance for an anomaly signal, by correcting the reconstruction error using smoothing and determining presence/absence of an anomaly signal using the corrected reconstruction error.

In addition, the anomaly detection apparatus 100 according to the present embodiment executes weighting for the reconstruction error on the basis of the cycle information, and determines presence/absence of an anomaly signal on the basis of the cycle information and the weighted reconstruction error. With this structure, the anomaly detection apparatus 100 according to the present embodiment enables further improvement of anomaly detection performance for an anomaly signal, by determining presence/absence of an anomaly signal using the reconstruction error weighted on the basis of the cycle information.

Second Embodiment

A second embodiment will be explained hereinafter. The present embodiment is acquired by modifying the structure of the first embodiment as follows. An explanation of the structure, the operation, and the effect similar to those of the first embodiment will be omitted.

Figure 13:
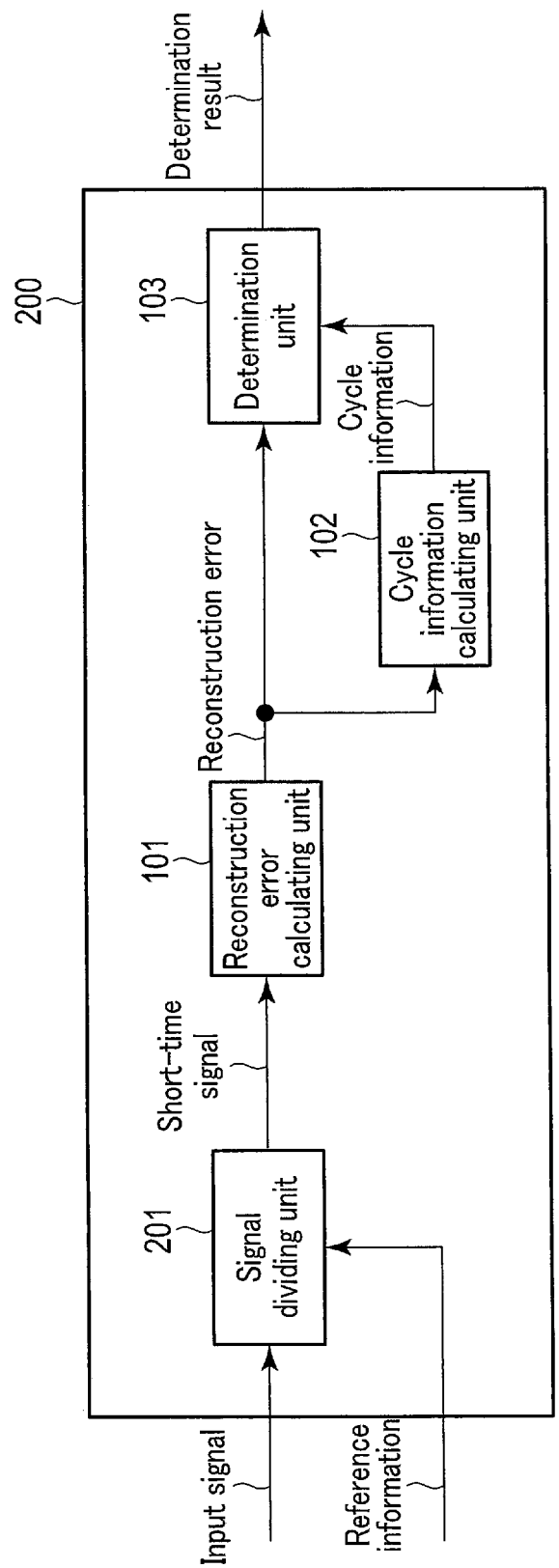
FIG. 13 is a diagram illustrating an example of configuration of an anomaly detection apparatus according to a second embodiment.

FIG. 13 is a diagram illustrating an example of configuration of an anomaly detection apparatus 200 according to the second embodiment. The anomaly detection apparatus 200 according to the second embodiment is used in a situation in which reference information used for determining the division unit of the input signal can be acquired. The anomaly detection apparatus 200 divides the input signal on the basis of the input signal and the acquired reference information, and detects an anomaly signal on the basis of the divided input signals.

In the anomaly detection apparatus 200 according to the present embodiment, the processing circuit further executes a function of a signal dividing unit 201 in addition to the functions of the reconstruction error calculating unit 101, the cycle information calculating unit 102, and the determination unit 103, by calling and executing a program in the storage medium.

The signal dividing unit 201 acquires the input signal and reference information. The reference information is information used for determining the division unit of the input signal. Information used as the reference information is, for example, a voltage value of AC voltage applied to the high-voltage power plant and/or the number of phases of the AC voltage. As another example, the reference information may be the number of trigger signals used in measurement of the input signal and/or the rotation number of the rotary member and the number of rotary members included in the device serving as a generation source of an anomaly signal.

The signal dividing unit 201 divides the input signal into two or more short signals (hereinafter referred to as "short-time signals") using the reference information. The signal dividing unit 201 outputs the generated short-time signals as the input signal to the reconstruction error calculating unit 101.

The signal dividing unit 201 divides the input signal into a plurality of short-time signals, with one cycle of the voltage phase used as the division unit, using, for example, the voltage value of the AC voltage in the input signal or the number of phases of the AC voltage as the reference information. When the voltage value of the AC voltage is acquired as the reference information, the signal dividing unit 201 calculates the length of phase for one cycle of the AC voltage using the voltage value of the AC voltage, and divides the input signal on the basis of the calculation result. When the number of phases of the AC voltage included in the input signal is acquired as the reference information, the signal dividing unit 201 divides the input signal into short-time signals of the same number as the number of phases. In this manner, the input signal is divided into short-time signals each including an input signal of the phase for one cycle of the AC voltage.

In the case of using, as the reference information, the number of trigger signals used in measurement of the input signal and/or the rotation number of the rotary member and the number of rotary members included in the device serving as a generation source of an anomaly signal, the signal dividing unit 201 divides the input signal equally into signals of the same number as the number of the reference information to generate short-time signals of the same number as the number of the reference information.

Figure 14:
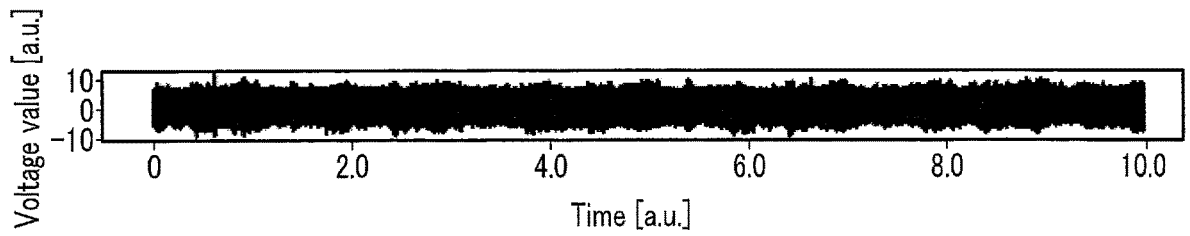
FIG. 14 is a diagram illustrating an example of an input signal acquired with the anomaly detection apparatus according to a second embodiment.
Figure 15:
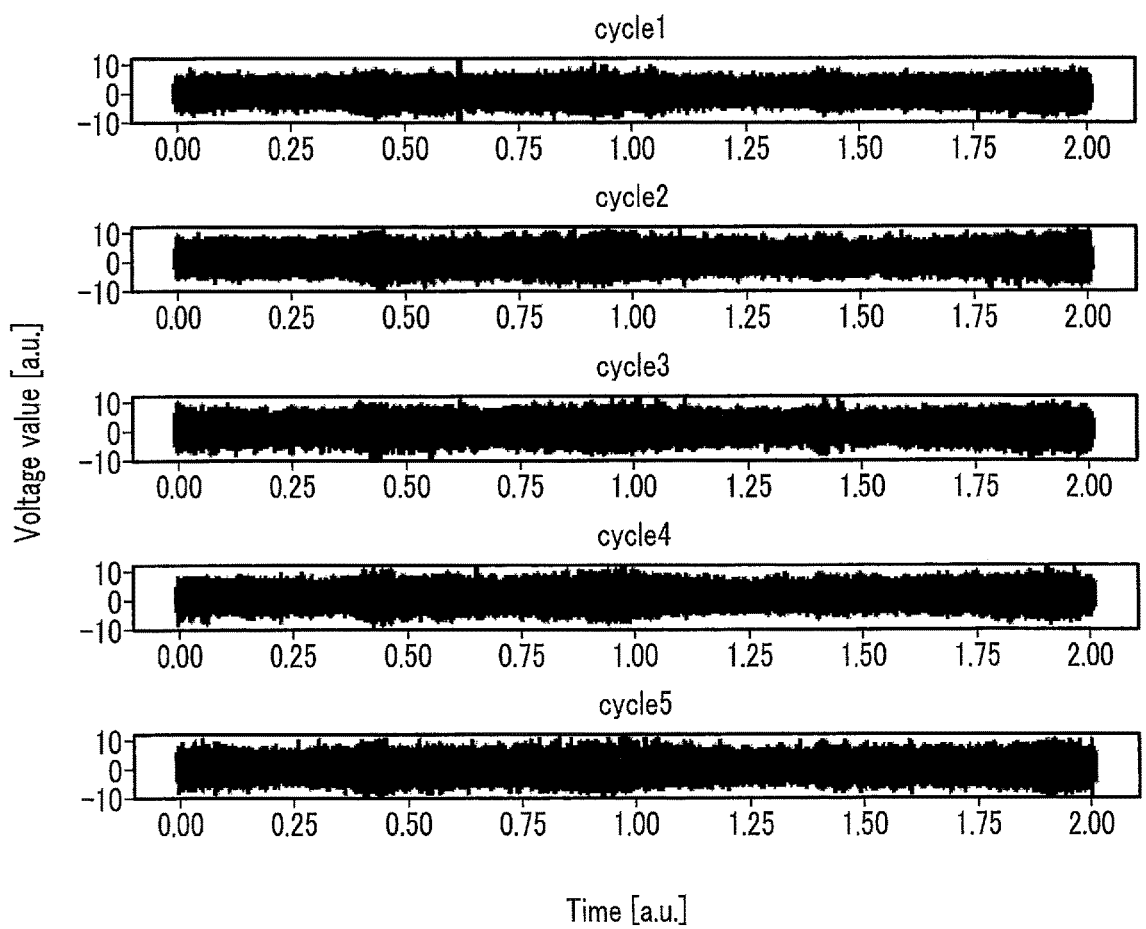
FIG. 15 is a diagram illustrating an example of short-time signals generated with the anomaly detection apparatus according to the second embodiment.

FIG. 14 is a diagram illustrating an example of an input signal. The horizontal axis of FIG. 14 indicates the time. The vertical axis of FIG. 14 indicates the voltage value of the input signal. The input signal illustrated in FIG. 14 includes a signal corresponding to five cycles of the AC voltage. When the input signal illustrated in FIG. 14 is divided, the signal dividing unit 201 acquires, for example, the number of cycles "5" as the reference information, and divides the input signal into five short-time signals. FIG. 15 is a diagram illustrating five short-time signals generated by dividing the input signal illustrated in FIG. 14. The horizontal axis of FIG. 15 indicates the value of the label (hereinafter referred to as "index") indicating the timing in the short-time signal. The vertical axis of FIG. 15 indicates the voltage value. The index corresponds to the phase in the AC voltage for one cycle.

The reconstruction error calculating unit 101 acquires a plurality of short-time signals generated in the signal dividing unit 201 as the input signal. The reconstruction error calculating unit 101 calculates a reconstruction error for each of the short-time signals by using a predetermined calculation method for the acquired short-time signal. The method for calculating a reconstruction error may be the same method as the method explained in the first embodiment.

FIG. 16 is a diagram illustrating, for each of five short-time signals, an example of reconstruction errors calculated for the respective short-time signals. Each of five graphs illustrated in FIG. 16 includes a reconstruction error calculated on the basis of the signal corresponding to one cycle of the AC voltage. The horizontal axis of FIG. 16 indicates the value of the index. The vertical axis of FIG. 16 indicates the value of the reconstruction error.

The cycle information calculating unit 102 calculates cycle information on the basis of the magnitude of the reconstruction error calculated for each of the short-time signals. The cycle information is, for example, information relating to the degree of dispersion of the timings (indexes) corresponding to the reconstruction errors selected in the respective short-time signals between the short-time signals. For example, the time in the short-time signal and/or the value of the phase of the AC voltage is used as the timing in the short-time signal. In this case, the degree of dispersion of the phases relating to the reconstruction errors selected for the respective short-time signals is used as the cycle information.

Figure 17:
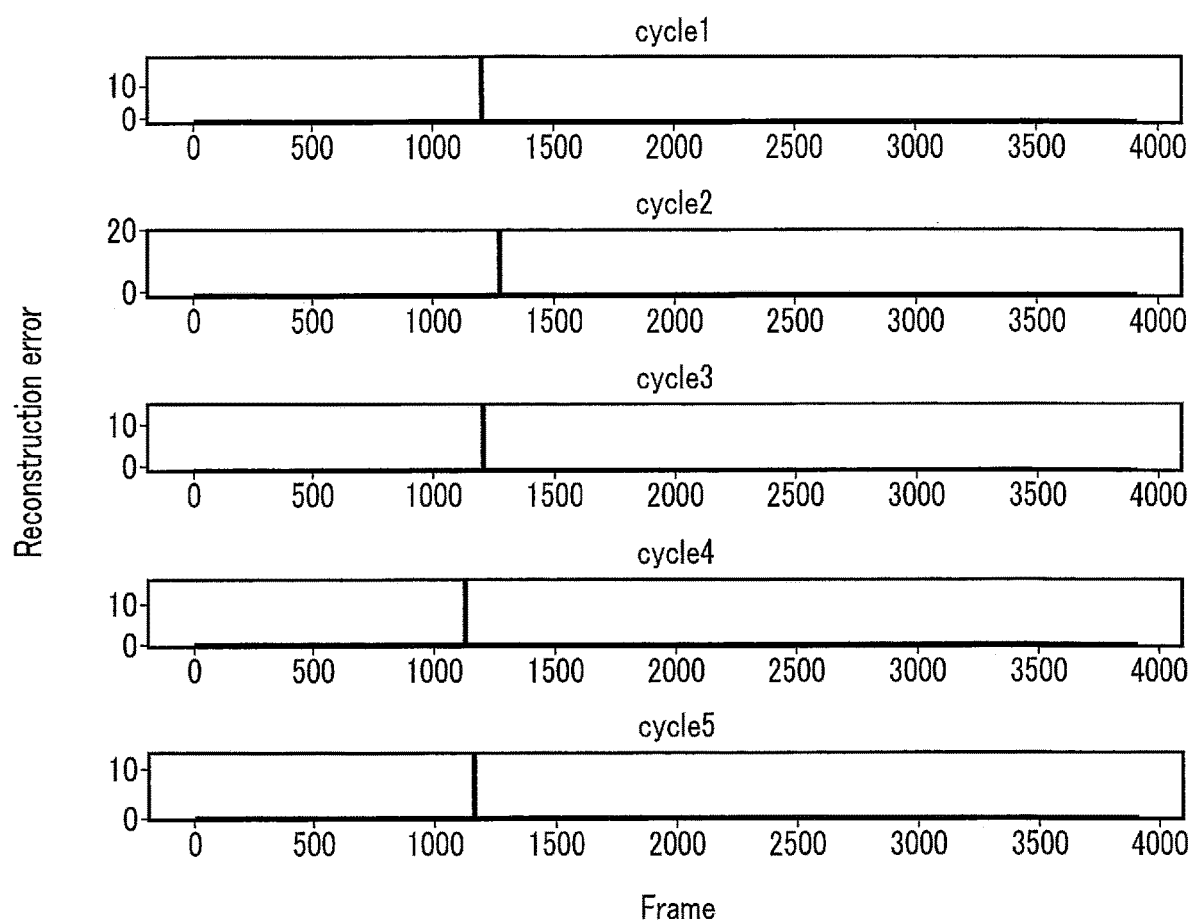
FIG. 17 is a diagram illustrating representative values selected for the respective short-time signals with the anomaly detection apparatus according to the second embodiment.

An example of the method for calculating the cycle information will be explained hereinafter with reference to FIG. 16 and FIG. 17. In the case of calculating the cycle information using the five reconstruction errors illustrated in FIG. 16, first, the cycle information calculating unit 102 selects the maximum value of the reconstruction error as a representative value, in each of the reconstruction errors calculated for the respective short-time signals. FIG. 17 is a diagram illustrating only the selected representative values. The horizontal axis of FIG. 17 indicates the index. The vertical axis of FIG. 17 indicates the reconstruction error.

Thereafter, the cycle information calculating unit 102 extracts the representative value having the largest reconstruction error in the selected five representative values, as the maximum value. The cycle information calculating unit 102 calculates a distance between the representative value and the maximum value on the basis of the index, for each of the representative values other than the maximum value. In this operation, a difference between the index of each of the four representative values other than the maximum value and the index of the maximum value is calculated as a distance based on the index from the maximum value. The cycle information calculating unit 102 outputs the four calculated distances as the cycle information.

The information used as the cycle information may be one or more of a distance based on the index between two representative values having the larger reconstruction errors in the representative values, a distance based on the minimum index in the distances between two representative values, a distance based on the maximum index in the distances between two representative values, a distance based on the minimum index in distances between three representative values having the larger reconstruction errors, and a standard deviation of the indexes of the representative values, instead of or in addition to the parameter described above.

The determination unit 103 acquires the standard deviation of the values of the indexes of the reconstruction errors selected in the respective short-time signals, and determines whether the selected reconstruction error is caused by an anomaly signal, by executing threshold determination for the acquired standard deviation. Thereafter, the determination unit 103 outputs a result of determination of presence/absence of an anomaly signal to the external device, such as a display device.

Figure 18:
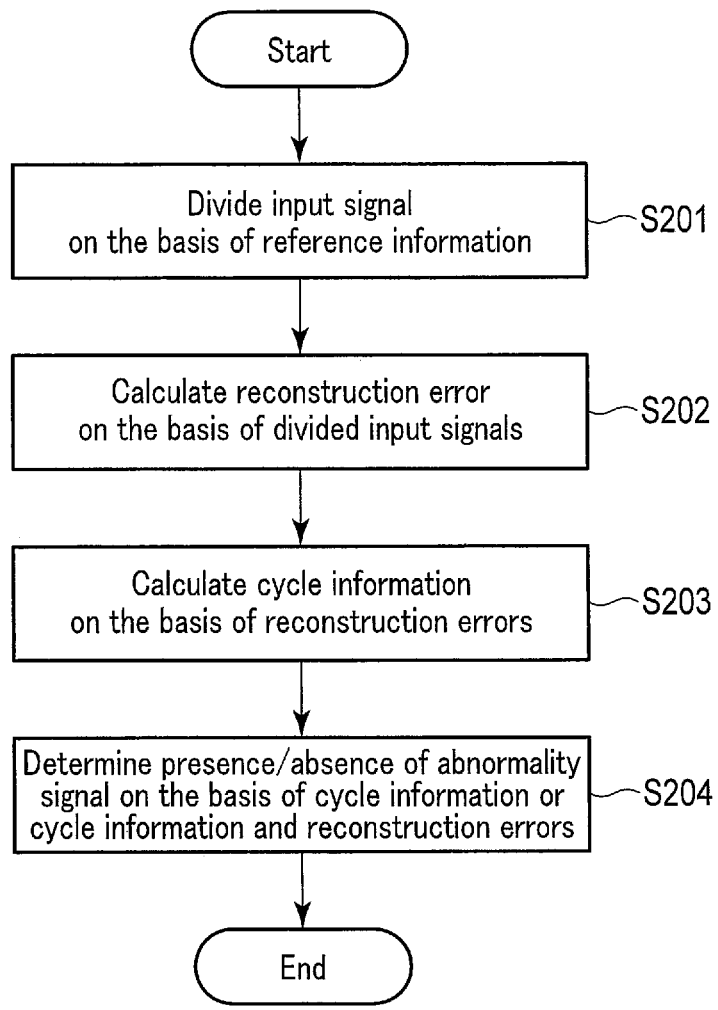
FIG. 18 is a flowchart illustrating processing procedure of the anomaly detection processing with the anomaly detection apparatus according to the second embodiment.

The following is an explanation of operations of a process executed with the anomaly detection apparatus 200. FIG. 18 is a flowchart illustrating an example of a process of the anomaly detection processing. The processing procedure in each processing explained hereinafter is a mere example, and each processing can be properly modified as long as modification is possible. In the processing procedure explained hereinafter, proper omission, replacement, and addition of steps are possible according to the embodiment.

(Anomaly Detection Processing)
(Step S201)
First, the signal dividing unit 201 acquires an input signal and reference information. The reference information includes the number of phases of the AC voltage of the input signal. The signal dividing unit 201 divides the input signal into short-time signals of the same number as the number of phases on the basis of the number of phases of the AC voltage, with one cycle of the voltage phase used as the division unit. The signal dividing unit 201 outputs the short-time signals as the input signal to the reconstruction error calculating unit 101.

(Step S202)
The reconstruction error calculating unit 101 calculates a reconstruction error for each of the short-time signals. The reconstruction error calculating unit 101 outputs the reconstruction errors calculated for the respective short-time signals to the cycle information calculating unit 102 and the determination unit 103.

(Step S203)
The cycle information calculating unit 102 calculates cycle information for each of the short-time signals on the basis of the calculated reconstruction error, and outputs the calculated cycle information to the determination unit 103. Specifically, the cycle information calculating unit 102 calculates, as the cycle information, the standard deviation of the phases relating to the reconstruction errors selected for the respective short-time signals.

(Step S204)
The determination unit 103 determines, for each of the short-time signals, presence/absence of an anomaly signal in the input signal on the basis of the cycle information or the cycle information and the reconstruction errors. For example, the determination unit 103 acquires the standard deviation of the values of the indexes of the reconstruction errors selected in the respective short-time signals, and determines whether the selected reconstruction error is caused by an anomaly signal, by executing threshold determination for the acquired standard deviation. Thereafter, the determination unit 103 outputs a result of determination of presence/absence of an anomaly signal to the external device.

The following is an explanation of effects of the anomaly detection apparatus 200 according to the present embodiment.

The anomaly detection apparatus 200 according to the present embodiment is capable of dividing the input signal into two or more short-time signals on the basis of the reference information, calculating a reconstruction error for each of the short-time signals, and calculating, as the cycle information, the degree of dispersion of the timings in the respective short-time signals for the reconstruction errors selected in the respective short-time signals.

The input signal is, for example, the voltage value of the AC voltage. The reference information is, for example, the voltage value of the AC voltage or the number of phases of the AC voltage. Each of the short-time signals includes, for example, the input signal of the phase for one cycle of the AC voltage. The timing in the short-time signal indicates, for example, the phase of the AC current.

With the structure described above, the anomaly detection apparatus 200 according to the present embodiment is enabled to determining the cyclic property of the reconstruction error with higher accuracy by dividing the input signal into short-time signals each corresponding to one cycle of the phase and using the degree of dispersion of timings in the respective short-time signals for the reconstruction errors selected for the respective short-time signals. This structure further improves anomaly detection performance for an anomaly signal having cyclic property.

Accordingly, each of the embodiments described above provides an anomaly detection apparatus, a method, and a program capable of determining presence/absence of an anomaly signal in the input signal with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An anomaly detection apparatus comprising at least one processing circuit configured to:
    calculate a reconstruction error of an input signal being a time-series signal,
    calculate cycle information indicating cyclic property of the reconstruction error, and
    determine presence/absence of an anomaly signal in the input signal on the basis of the cycle information or the cycle information and the reconstruction error.

2. The anomaly detection apparatus according to claim 1, wherein the at least one processing circuit is configured to acquire a reference signal synchronized with a cycle of the input signal, and calculates similarity between the reconstruction error and the reference signal as the cycle information.

3. The anomaly detection apparatus according to claim 1, wherein the cycle information is a feature quantity generated by executing Fourier transform for a vector generated by arranging values of the reconstruction error.

4. The anomaly detection apparatus according to claim 1, wherein the cycle information is a degree of dispersion of two or more times selected on the basis of magnitude of values of the reconstruction error.

5. The anomaly detection apparatus according to claim 1, wherein the at least one processing circuit is configured to;
    divide the input signal into two or more short-time signals on the basis of reference information,
    calculate the reconstruction error for each of the short-time signals, and
    calculate, as the cycle information, a degree of dispersion of timings in the respective short-time signals for the reconstruction errors selected in the respective short-time signals.

6. The anomaly detection apparatus according to claim 5, wherein
    the input signal is a voltage value of AC voltage,
    the reference information is a voltage value of the AC voltage or the number of phases of the AC voltage,
    each of the short-time signals includes the input signal of a phase for one cycle of the AC voltage, and
    each of the timings in the respective short-time signals indicates a phase of the AC current.

7. The anomaly detection apparatus according to claim 1, wherein the at least one processing circuit is configured to calculate a smoothed signal on the basis of the reconstruction error, and corrects the reconstruction error by subtracting the smoothed signal from the reconstruction error.

8. The anomaly detection apparatus according to claim 1, wherein the at least one processing circuit is configured to execute weighting for the reconstruction error on the basis of the cycle information, and determine presence/absence of the anomaly signal on the basis of the cycle information and the weighted reconstruction error.

9. A method, implemented by at least one processing circuit of an anomaly detection apparatus, comprising:
    calculating a reconstruction error of an input signal being a time-series signal;
    calculating cycle information indicating cyclic property of the reconstruction error; and
    determining presence/absence of an anomaly signal in the input signal on the basis of the cycle information or the cycle information and the reconstruction error.

10. A non-transitory computer-readable storage medium storing a program for causing a computer to execute:
    a function of calculating cycle information indicating cyclic property of the reconstruction error; and
    a function of determining presence/absence of an anomaly signal in the input signal on the basis of the cycle information or the cycle information and the reconstruction error.

* * * * *